United States Patent [19]

Crawford et al.

[11] Patent Number: 4,771,248

[45] Date of Patent: Sep. 13, 1988

[54] FAST PHASE-LOCK FREQUENCY SYNTHESIZER

[75] Inventors: James A. Crawford, Fullerton; Gary D. Frey, Garden Grove, both of Calif.

[73] Assignee: Hughes Aircraft Company, Los Angeles, Calif.

[21] Appl. No.: 946,405

[22] Filed: Dec. 22, 1986

Related U.S. Application Data

[63] Continuation of Ser. No. 756,407, Jul. 17, 1985, Pat. No. 4,668,922.

[51] Int. Cl.$^4$ ............................................. H03L 7/18
[52] U.S. Cl. ..................................... 331/1 A; 331/8; 331/14; 331/17; 331/27
[58] Field of Search .................... 331/1 A, 8, 14, 16, 331/17, 18, 25, 27; 328/133, 134, 155; 307/516, 526

[56] References Cited

U.S. PATENT DOCUMENTS

| | | | |
|---|---|---|---|
| 4,313,209 | 1/1982 | Drucker | 331/23 X |
| 4,382,234 | 5/1983 | Olbrechts | 331/27 X |
| 4,392,113 | 7/1983 | Jackson | 331/14 |
| 4,568,888 | 2/1986 | Kimura et al. | 331/10 |

Primary Examiner—Siegfried H. Grimm
Attorney, Agent, or Firm—Thomas A. Runk; Anthony W. Karambelas

[57] ABSTRACT

A phase-locked frequency synthesizer (10) having a voltage controlled oscillator (40), a divider circuit (60), and a sample-and-hold phase detector (30, 80, 90, 100, 110) which utilizes gain compensation (90,110) for optimizing phase-locking speed. The sample-and-hold circuit (FIG. 6) also includes circuitry for substantially reducing perturbations at its output. The frequency synthesizer further includes control circuitry (70) and a reference frequency generator (20) for quickly reinitializing the synthesizer in response to a command to change frequency.

2 Claims, 5 Drawing Sheets

FAST PHASE-LOCK FREQUENCY SYNTHESIZER

The United States government has rights to this invention pursuant to Contract No. N00024-82-C-5353 awarded by the Department of the Navy.

BACKGROUND OF THE INVENTION

This is a continuation of application Ser. No. 756,407, filed July 17, 1985 and now U.S. Pat. No. 4,668,922.

The disclosed invention generally relates to frequency synthesizers and is more particularly directed to a frequency synthesizer having very fast frequency switching times and very fast phase-lock capabilities.

Frequency synthesizers are commonly employed to generate a frequency or frequencies based on a reference frequency. A commonly utilized technique is known as phase-locked or indirect frequency synthesis. Phase-locked frequency synthesizers are extensively described in the published art including for example "The Digiphase Synthesizer," by Garry C. Gillette, a paper presented in 1969 at the twenty-third Annual Frequency Control Symposium; "Low-Noise Frequency Synthesizers Using Fractional N Phase-Locked Loops," Ulrich Rhode, RF Design, January/February 1981, pp. 20–34; "A Synthesized Signal Source with Function Generator Capabilities," Dan D. Danielson and Stanley E. Froseth, Hewlett-Packard Journal, January, 1979, pp. 18–26; "Frequency Synthesis: Techniques and Applications," J. Gorski-Popiel, IEEE Press, 1975; and "Frequency Synthesis by Phase Lock," William F. Egan, John Wiley & Sons, 1981. Other examples of phase-locked frequency synthesizers include U.S. Pat. No. 4,290,028, issued to Jesse S. LeGrand on Sept. 15, 1981; U.S. Pat. No. 4,330,758, issued to Scott N. Swisher et al on May 18, 1982; and U.S. Pat. No. 4,434,407, issued to Daniel J. Healey, III et al on Feb. 28, 1984.

Phase-locked frequency synthesizers typically include a voltage controlled oscillator (VCO) which provides the output frequency. The VCO output frequency is coupled via a variable ratio frequency divider circuit to a phase detector. The reference frequency provides another input to the phase detector which provides an error signal for controlling the VCO. When the loop is locked, the two inputs to the phase detector have a constant phase relation and therefore the same frequency. The output of the VCO would then have a frequency equal to the reference frequency multiplied by the inverse of the divider circuit ratio.

Many types of phase detectors are utilized in phase-locked frequency synthesizers, including balanced mixers, high-speed samplers, exclusive-OR circuits, flip-flop circuits, and sample-and-hold circuits.

In a sample-and-hold phase detector, the phase relation between the divider circuit output and the reference frequency is sampled and held until the next sampling occurs. Sample-and-hold phase detectors provide high performance and can be readily embodied in integrated circuitry. However, presently known sample-and-hold phase detectors tend to be relatively slow in responding to commands to change the synthesizer output frequency. Further, sample-and-hold circuitry typically causes spurious signals in the VCO output because of glitches resulting from the sampling pulse and because of current leakage with respect to the hold capacitor of the phase detector.

SUMMARY OF THE INVENTION

It is an object of the invention to provide an improved frequency synthesizer which quickly responds to a command to change the synthesizer output frequency.

It is also an object of the invention to provide an improved frequency synthesizer which achieves high speed phase lock.

Still another object of the invention is to provide an improved frequency synthesizer with improved noise performance.

Another object of the invention is to provide an improved frequency synthesizer which includes gain compensation for achieving fast phase-lock.

Yet another object of the invention is to provide an improved sample-and-hold circuit which compensates for current leakage.

A further object of the invention is to provide an improved sample-and-hold circuit which is fast and produces very low glitches.

The foregoing and other objects of the invention are accomplished in a phase-locked frequency synthesizer having a high-speed sample-and-hold phase detector responsive to a reference frequency and a divide-by-N signal, a voltage controlled oscillator (VCO) controlled by the phase detector, and a divide-by-N circuit responsive to the VCO output and which provides the divide-by-N signal to the phase detector. The frequency synthesizer further includes control circuitry responsive to frequency change signals for quickly resynchronizing the reference frequency and the phase detector. The sample-and-hold phase detector includes gain control circuitry for optimizing the gain of the phase detector as a function of the divide-by-N signal, a sample-and-hold circuit having a small sample period, and neutralization circuitry for neutralizing the effect of current leakage.

BRIEF DESCRIPTION OF THE DRAWINGS

The advantages and features of the disclosed invention will readily be appreciated by persons skilled in the art from the following detailed description when read in conjunction with the accompanying drawing wherein.

DETAILED DESCRIPTION

Figure 1:
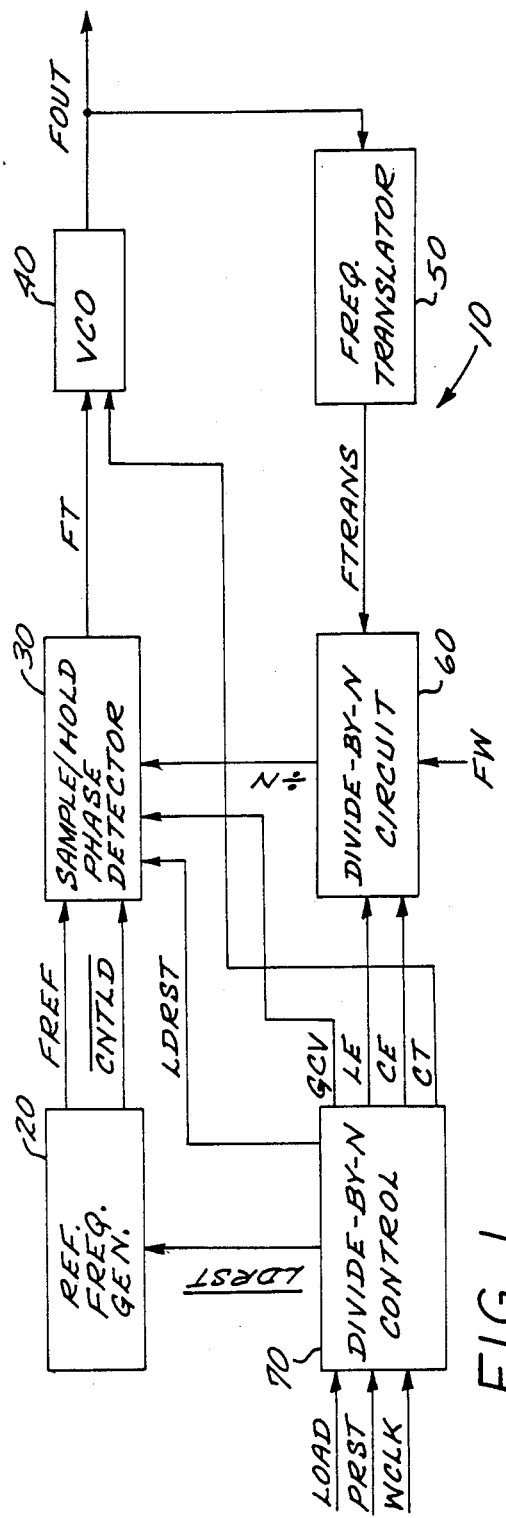
FIG. 1 is a block diagram of the disclosed frequency synthesizer.

In the following detailed description and in the several figures of the drawing, like elements are identified with like reference numerals.

Referring now to FIG. 1, shown therein is a block diagram of the disclosed frequency synthesizer 10 which includes a reference frequency generator 20, a sample-and-hold (S/H) phase detector 30, and a voltage controlled oscillator (VCO) 40. The reference frequency generator 20 provides a reference frequency FREF to the S/H phase detector 30, and further provides a negated count load signal $\overline{\text{CNTLD}}$ for resetting a ramp generator (described more fully below) in the S/H phase detector 30. The S/H phase detector 30 provides a fine-tune signal FT to the voltage controlled oscillator 40. The VCO 40 provides the frequency synthesizer output FOUT which has a frequency that is a function of the voltage of the fine-tune signal FT. As is well known, a voltage controlled oscillator can be coarse tuned to a particular frequency and then can be fine tuned with a fine tune signal. As shown, the VCO 40 accepts a coarse tune signal CT from a control circuit described further below.

The frequency synthesizer 10 further includes a frequency translator 50 which accepts the signal FOUT as an input and provides an output signal FTRANS which has a frequency that is the difference between a fixed frequency and the frequency of the output signal FOUT. By way of example, FOUT can have a frequency from 1275 MHz to 1530 MHz, and the frequency translator 50 reduces a fixed frequency of 1800 MHz by the frequency of FOUT. The signal FTRANS would have a frequency from 270 MHz to 525 MHz. The primary purpose of the frequency translator 50 is to provide frequencies within the operating range of available pulse dividing circuitry.

The FTRANS signal is provided to a divide-by-N circuit 60 which provides a divide-by-N signal ($\div$N) as a function of a frequency word input signal FW which has a value N, where N is an integer. Specifically, the divide-by-N circuit 60 provides a divide-by-N signal pulse for every $N^{th}$ pulse of the FTRANS signal. The divide-by-N circuit 60 is controlled by a load enable signal LE and a count enable signal CE which are provided by a divide-by-N control circuit 70.

When the frequency synthesizer 10 is in phase-lock, the divide-by-N signal will be in a fixed phase relation with the reference signal FREF. The relation between the frequencies of FREF and FOUT can be defined as follows for the above example where the frequency translator 50 includes a fixed frequency of 1800 MHz:

$$f(\text{FTRANS}) = 1800 - f(\text{FOUT}) \quad \text{(Eq. 1)}$$

$$f(\text{FTRANS}) = Nf(\text{FREF}) \quad \text{(Eq. 2)}$$

$$1800 - f(\text{FOUT}) = Nf(\text{FREF}) \quad \text{(Eq. 3)}$$

$$f(\text{FOUT}) = 1800 - Nf(\text{FREF}) \quad \text{(Eq. 4)}$$

Thus, the frequency of FOUT is determined by the value of the division ratio N and the frequency of the reference signal FREF. In the disclosed embodiment, the reference signal FREF has frequency of 3 MHz. Therefore, for the previously mentioned exemplary maximum frequency for FOUT of 1530 MHz, the value for the division ratio N would be 90. For a minimum frequency for FOUT of 1275 MHz, the value for the division ratio N would be 175.

The divide-by-N control circuit 70 is responsive to externally provided signals for controlling the frequency of the synthesizer output FOUT. Specifically the divide-by-N control circuit 70 is responsive to a LOAD signal, a preset data signal PRST, and a word clock signal WCLK. The LOAD signal indicates that a new frequency will be programmed into the frequency synthesizer 10, the preset data signal PRST is indicative of the new frequency, and the clock signal WCLK causes the preset data signal PRST to be read in. In response to the LOAD signal a load reset signal LDRST is provided to S/H phase detector 30 and a negated load reset signal $\overline{\text{LDRST}}$ is provided to the reference generator 20, indicating to the those circuits that a new frequency is being programmed. The presence of the LOAD signal further causes the count enable signal CE to go high to prevent the divide-by-N circuit 60 from providing any divide-by-N signal pulses for a predetermined period. In response to the preset data signal PRST, the divide-by-N control circuit 70 provides to the VCO 40 a coarse tune signal CT indicative of the new frequency.

Pursuant to the LOAD signal, the load enable signal LE is provided to the divide-by-N circuit 60 which reads in a frequency word signal FW which has the new value of N that is indicative of the new frequency. When the load enable signal LE goes low, the count enable signal CE goes high to allow the divide-by-N circuit 60 to provide divide-by-N pulses to the S/H phase detector 30.

The divide-by-N control circuit 70 further provides to the S/H phase detector 30 a gain control voltage (GCV) signal which has a level indicative of the frequency data provided by the preset data signal PRST. The gain control signal GCV is utilized by the S/H phase detector 30 to provide gain compensation as a function of the division ratio N (discussed below).

Figure 2:
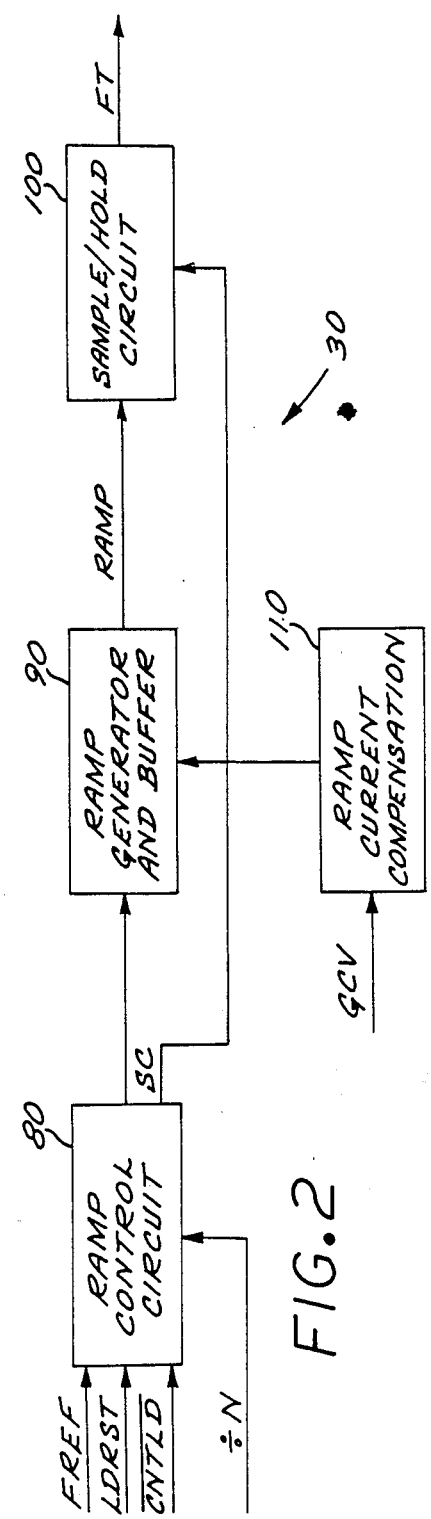
FIG. 2 is a block diagram of the sample-and-hold phase detector of the frequency synthesizer of FIG. 1.

Referring now to FIG. 2, shown therein is a block diagram schematic of the major components of the S/H phase detector 30 which includes a ramp control circuit 80 for controlling a ramp generator 90. The ramp control circuit 80 is responsive to the reference frequency signal FREF, the load reset signal LDRST, the negated count load signal $\overline{\text{CNTLD}}$ and the divide-by-N signal. As will be discussed more fully with reference to the timing diagram of FIG. 5, the RAMP signal is started by the leading edge of the FREF signal and is stopped by the leading edge of a divide-by-N signal pulse. The RAMP signal is reset to its initial fixed value by one of several signals and remains at that value until the next occurrence of an FREF pulse. The ramp control circuit 80 further produces a sample control signal SC which comprises a series of pulses which correspond to the divide-by-N signal pulses. Particularly, a sample control signal SC pulse occurs pursuant to each occurrence of a divide-by-N signal pulse.

The RAMP signal from the ramp generator and buffer 90 is provided to a sample-and-hold (S/H) circuit 100 which also accepts as an input the sample control signal SC from the ramp control circuit 80. As will be discussed more fully below, the S/H circuit 100 samples the value of the RAMP signal pursuant to the occurrence of a sample control signal SC pulse.

Figure 5:
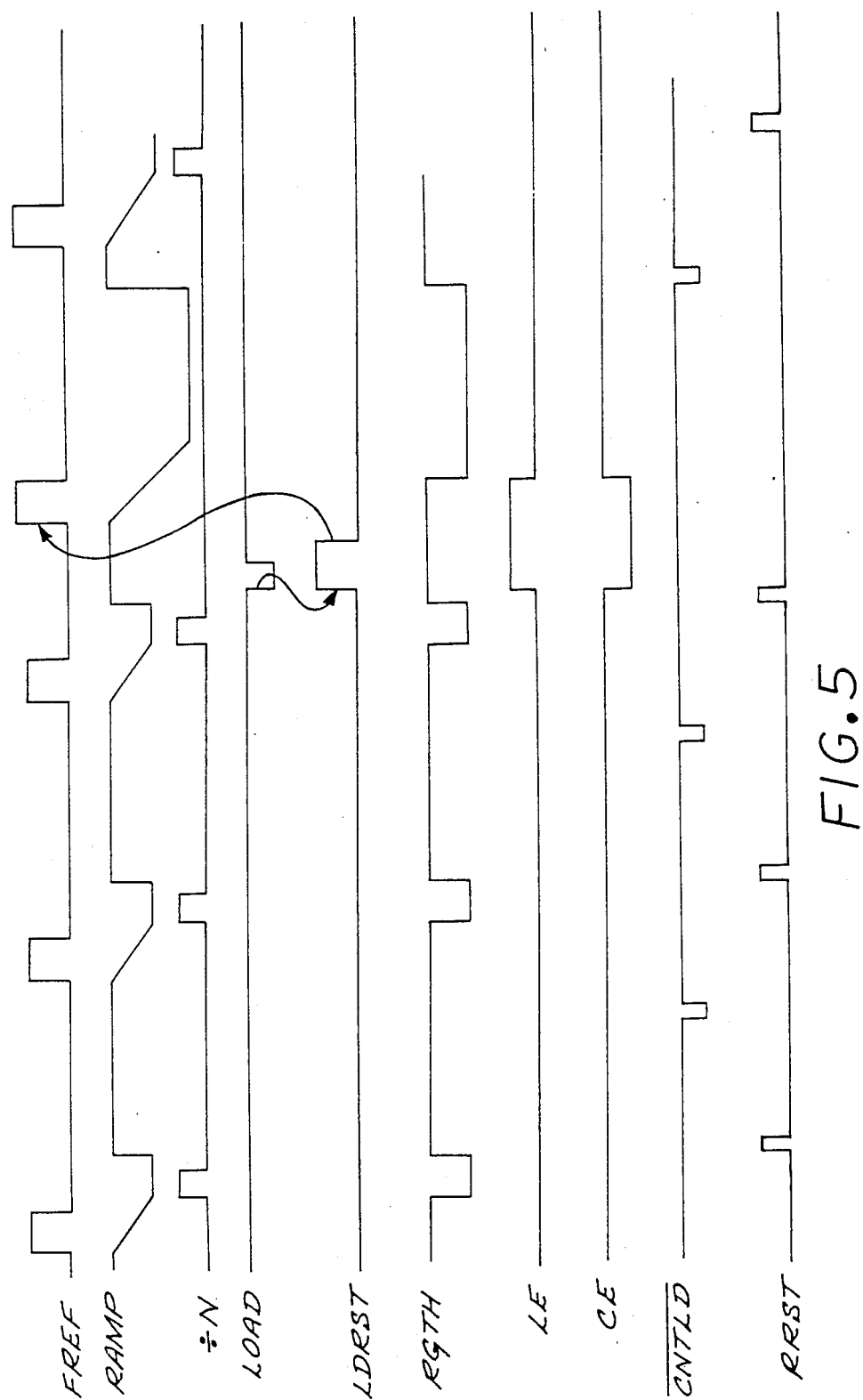
FIG. 5 is a timing diagram of certain signals in the frequency synthesizer of FIGS. 1 through 4.

The S/H phase detector 30 further includes a ramp current compensation circuit 110 which is responsive to the gain control signal GCV. By way of example, the ramp generator and buffer 90 may include a constant current source for appropriately charging a ramp capacitor. The ramp current compensation circuit 110 could then be a voltage controlled current source which modifies the current provided to the ramp generator buffer 90. Thus, the slope of the RAMP signal is controlled by the ramp compensation circuit 110 as a function of the gain control signal GCV. The voltage of the gain control signal GCV is controlled by the value of the preset data signal PREST which is indicative of the desired frequency of FOUT and, therefore, is indicative of the value of the division ratio N. For the negative going RAMP signal as shown in FIG. 5, it is contemplated that as the division ratio N increases the ramp becomes steeper. This follows from the known fact that in order to achieve fast lock ideally the phase detector gain ($K_p$) and the VCO gain ($K_v$) should be related as follows:

$$C=(K_pK_v)/N \qquad \text{(Eq. 5)}$$

In the foregoing equation, C is a constant and the VCO gain $K_v$ will generally be constant. Therefore, the ratio $K_p/N$ should be held to a constant. Since the gain $K_p$ of the S/H phase detector 30 is proportional to the slope of the RAMP signal, changing the ramp current as a function of the division ratio N will allow for a substantially constant value for the ratio $K_p/N$. Thus, whenever a new frequency is chosen by an appropriately chosen value for the division ratio N, the divide-by-N control circuit 70 provides a gain control signal GCV having a voltage level that is a function of the newly chosen division ratio N. By doing so, the ideal conditions of Equation 5 are approached and fast lock can be achieved.

Figure 3:
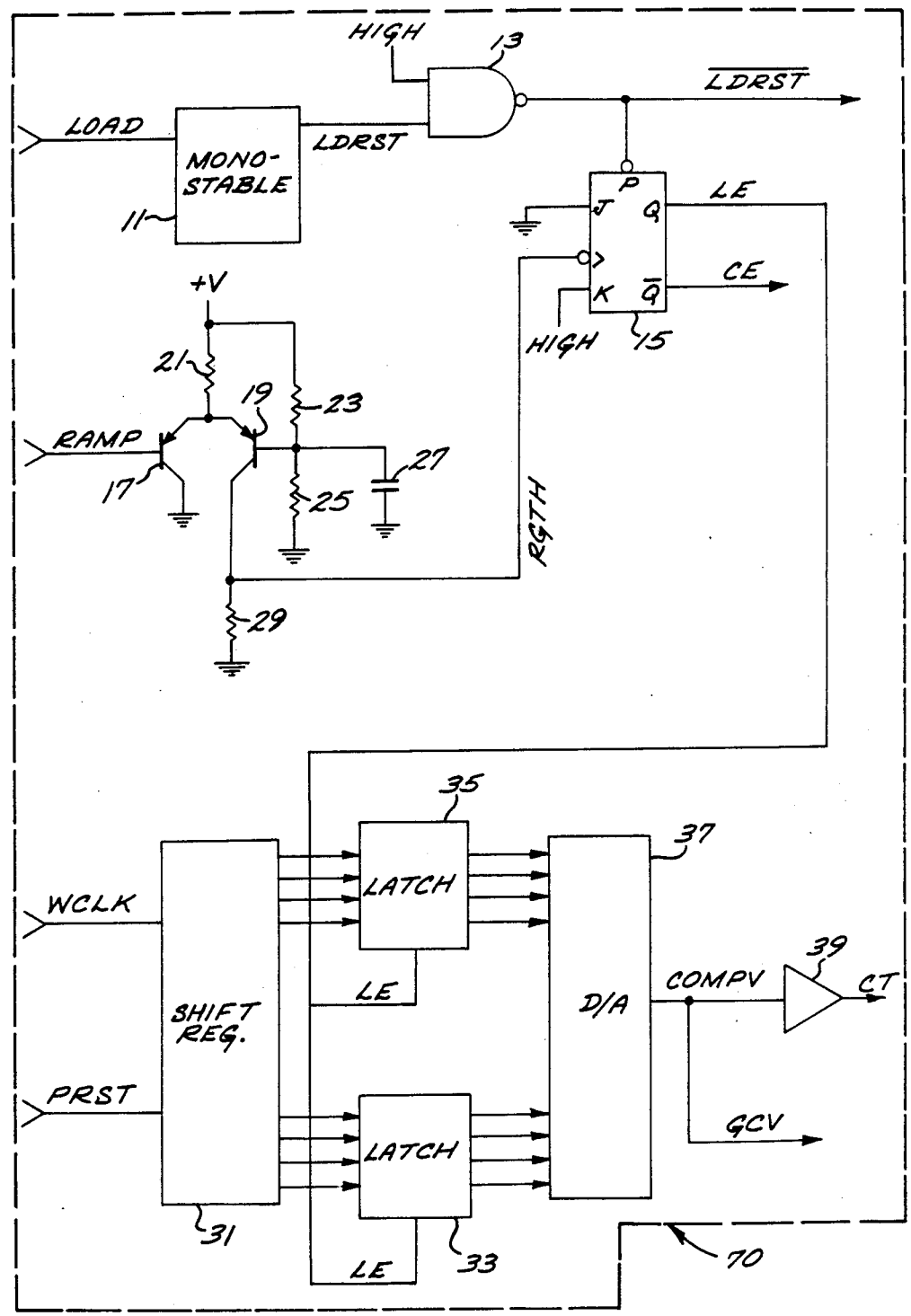
FIG. 3 is a circuit schematic diagram of the divide-by-N control circuit of the frequency synthesizer of FIG. 1.

Referring now to FIG. 3, shown therein is a detailed circuit schematic of the divide-by-N control circuit 70 which includes a retriggerable monostable 11 for accepting the LOAD signal as an input. The monostable 11 provides an output at its Q terminal which is coupled to one input of a NAND gate 13. The other input to the NAND gate 13 is tied to high. The output of the monostable 11 is the load reset signal LDRST, and the output of the NAND gate 13 is the negated load reset signal $\overline{\text{LDRST}}$.

The output of the NAND gate 13 is coupled to the preset terminal P of a JK flip-flop 15 which provides the load enable signal LE at its Q output and further provides the count enable signal CE at its $\overline{Q}$ output. The J input to the JK flip-flop 15 is tied to ground, while the K input to the JK flip-flop 15 is tied to high. The JK flip-flop 15 is clocked by a signal identified as RGTH, which is a mnemonic for ramp goes through half. The RGTH pulse is generated when the RAMP signal goes through roughly one-half of its maximum value. For the disclosed example where the ramp is negative-going, the signal RGTH indicates that the ramp has gone through roughly one-half of its maximum negative value.

The RGTH signal is generated by a circuit which includes differentially coupled transistors 17 and 19 which have their emitters connected together and coupled to a source of positive voltage +V via a resistor 21. The RAMP signal is applied to the base of the transistor 17 which has its collector connected to ground. The base of the transistor 19 is coupled to the source of positive voltage +V through a resistor 23, and is also coupled to ground via a resistor 25 and a capacitor 27 in parallel. A resistor 29 is connected between the collector of the transistor 19 and ground. The signal RGTH is generated at the collector of the transistor 19. The values of the components of this circuit are selected so that the signal RGTH is high whenever the RAMP signal is roughly one-half of its maximum negative value or greater (i.e., more negative than the one-half value).

The divide-by-N control circuit 70 further includes an 8-bit shift register 31 which accepts as its input the preset data signal PRST and is clocked by the word clock signal WCLK. The 8-bit output of the shift register 31 is provided to a pair of 4-bit latches 33 and 35. The latches 33 and 35 are enabled by the load enable signal LE to transfer to their outputs data applied to their inputs. Since the load enable signal LE is generated pursuant to the LOAD signal, the preset data signal PRST must be read into the shift register 31 prior to occurrence of the LOAD signal.

The outputs of the latches 33 and 35 are provided to a digital-to-analog (D/A) converter 37 which provides an output voltage indicative of the digital value of the preset data signal PRST. The output of the D/A converter 37 is the compensation voltage signal COMPV. The output of the D/A converter 37 is coupled to an operational amplifier 39 whose output is the coarse tune signal CT for the VCO 40.

Figure 4:
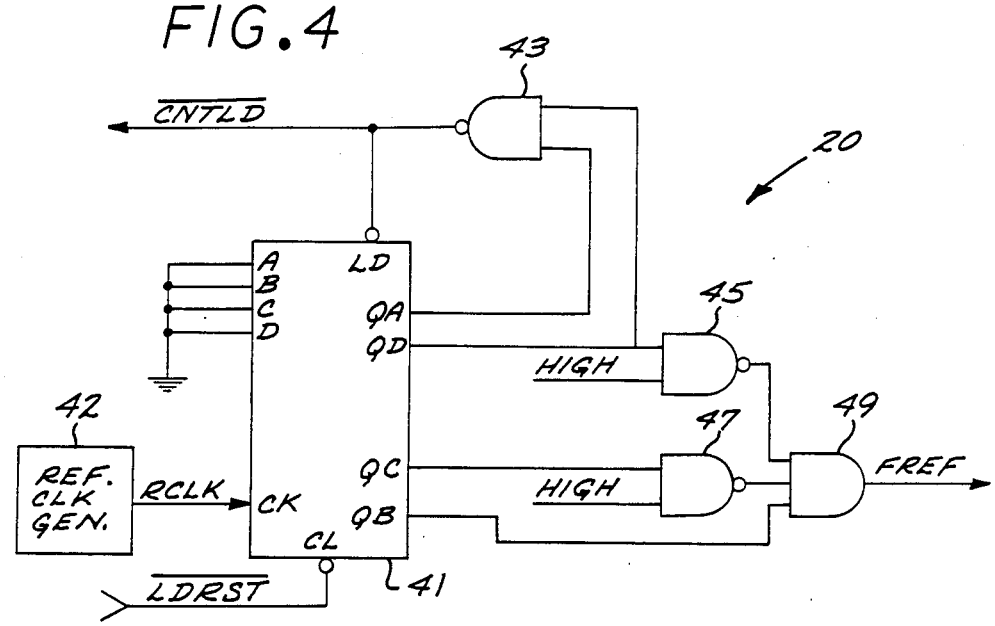
FIG. 4 is a circuit schematic diagram of the frequency reference generator of the frequency synthesizer of FIG. 1.

Referring now to FIG. 4, shown therein is a circuit schematic of the reference generator 20 which includes a decade counter 41 which is clocked by a reference clock RCLK that is provided by a reference clock generator 42. The clear terminal CL of the decade counter 41 receives the negated load reset signal $\overline{\text{LDRST}}$ provided by the divide-by-N control circuit 70. The count preset inputs A, B, C, and D of the decade counter 41 are held low. The QA and QD outputs of the decade counter 41 are inputs to a NAND-gate 43 which has its output connected to the load input terminal LD of the decade counter. The output of the NAND-gate 43 is the negated count load signal $\overline{\text{CNTLD}}$. When the negated count load signal $\overline{\text{CNTLD}}$ is low, the decade counter is preset to the count at its inputs A, B, C, and D, which for the disclosed example would result in a low signal at each of the decade counter outputs QA, QB, QC, and QD.

The QD output of the decade counter 41 is further an input to a NAND-gate 45 which has its other input tied to high. The QC output of the decade counter 41 is provided to a NAND-gate 47 which has its other input tied to high. The outputs of the NAND-gates 45 and 47 and the QB output of the decade counter 41 are provided to a three-input AND-gate 49. The output of the AND-gate 49 is the reference signal FREF.

The following Table I sets forth the levels of the reference signal FREF and the negated count load signal $\overline{\text{CNTLD}}$ as a function of the output states of the decade counter 41. In Table I, a low signal is represented as a "0" and a high signal is represented as a "1."

As can be seen from the foregoing, the reference signal FREF provides a pulse for every 10 counts of the decade counter 41, which effectively divides down the reference clock RCLK by a factor of 10. For the disclosed embodiment, wherein the reference signal FREF is 3MHz, the reference clock generator 42 provides a reference clock signal RCLK having a frequency of 30 MHz.

The above-described reference generator 20 is advantageously utilized to reduce the wasted time in reinitializing the S/H phase detector 30 in response to a frequency change. The command to change frequency is provided by a LOAD signal pulse. The functions and timing of the divide-by-N control circuit 70 and the reference generator 20 pursuant to a command to change frequency can be better understood with reference to the timing diagram of FIG. 5, which will be initially discussed relative to a few sample-and-hold cycles before the occurrence of a LOAD signal pulse.

Referring particularly to FIG. 5, a positive going edge of the reference frequency signal FREF starts the RAMP signal. The RAMP signal is stopped by a positive going edge of the divide-by-N signal (÷N). The RAMP signal is reset to its initial fixed value by a ramp reset signal RRST which is internal to the ramp control circuit 80 and is adapted to provide a positive pulse following a predetermined delay after occurrence of a divide-by-N pulse. Such predetermined delay must be sufficient to allow the S/H circuit 100 to sample the level of the RAMP signal.

The "ramp goes through half" signal RGTH goes low when the RAMP signal is about one-half of its maximum negative voltage, and stays low until the RAMP signal is reset to its initial value. Prior to a LOAD pulse, although the negative going edges of the RGTH signal clocks the JK flip-flop 15 (FIG. 3), the load enable signal LE stays low and the count enable signal CE stays high since the J input is held low while the K input is held high.

The negated count load signal $\overline{\text{CNTLD}}$ occurs whenever the output state of the decade counter is 1001 (FIG. 4 and Table I). In the event the RAMP signal has not been reset to its initial value when the $\overline{\text{CNTLD}}$ signal goes low, the $\overline{\text{CNTLD}}$ signal causes the RAMP signal to be reset.

Upon the occurrence of a negative going LOAD pulse, the load reset signal LDRST goes high which causes the ramp control circuit 80 to reset the RAMP to its initial value. The negated load reset signal $\overline{\text{LDRST}}$ goes low pursuant to the LOAD pulse and causes the decade counter 41 (FIG. 4) to be cleared to provide an output of 0000. The negated load reset signal $\overline{\text{LDRST}}$ also causes the JK flip-flop 15 (FIG. 3) to be preset, whereby the load enable signal LE (Q output) goes high and the count enable signal CE ($\overline{\text{Q}}$ output) goes low. This disables the divide-by-N circuit (FIG. 1), thereby preventing any divide-by-N pulses and enables the divide-by-N circuit to read in the frequency word FW. The load enable signal LE also allows the preset data signal PRST to be latched to the outputs of the latches 33 and 35 (FIG. 3).

After the decade counter 41 (FIG. 4) is preset to 0000 by the negated load reset signal $\overline{\text{LDRST}}$, it is clocked by the reference clock RCLK to provide the output states of Table I. When the decade counter 41 reaches the output state 0010, FREF goes high, thereby causing the RAMP signal to ramp (FIG. 5). The "ramp goes through half" signal RGTH eventually goes low, thereby clocking the JK flip-flop 15 (FIG. 3) to cause the load enable signal to go low and the count enable signal to go high. The divide-by-N circuit will then start counting to provide a divide-by-N pulse for every Nth pulse of the translated signal FTRANS.

In the disclosed example where N would be 90 or greater, a long interval would pass if the RAMP signal had to be reset by the divide-by-N signal after a new frequency is commanded by the LOAD signal. Such a long interval is avoided by utilizing the negated count load signal $\overline{\text{CNTLD}}$ to reset the RAMP signal if it is not already reset to its initial state. After the LOAD operation and the subsequent reset of the RAMP signal by the negated count load signal $\overline{\text{CNTLD}}$, subsequent $\overline{\text{CNTLD}}$ pulses will occur at times when the RAMP signal will have been reset to its initial level by the divide-by-N signal.

The foregoing described divide-by-N control circuit 70 and reference frequency generator 20 cooperate to achieve very fast reinitialization of the S/H phase detector 30 after a LOAD operation. This is accomplished by restarting the reference frequency FREF so that an FREF pulse occurs after only two cycles of the 30 MHz reference clock RCLK and by resetting the RAMP signal with the negated count load signal $\overline{\text{CNTLD}}$ instead of waiting for a divide-by-N pulse.

Figure 6:
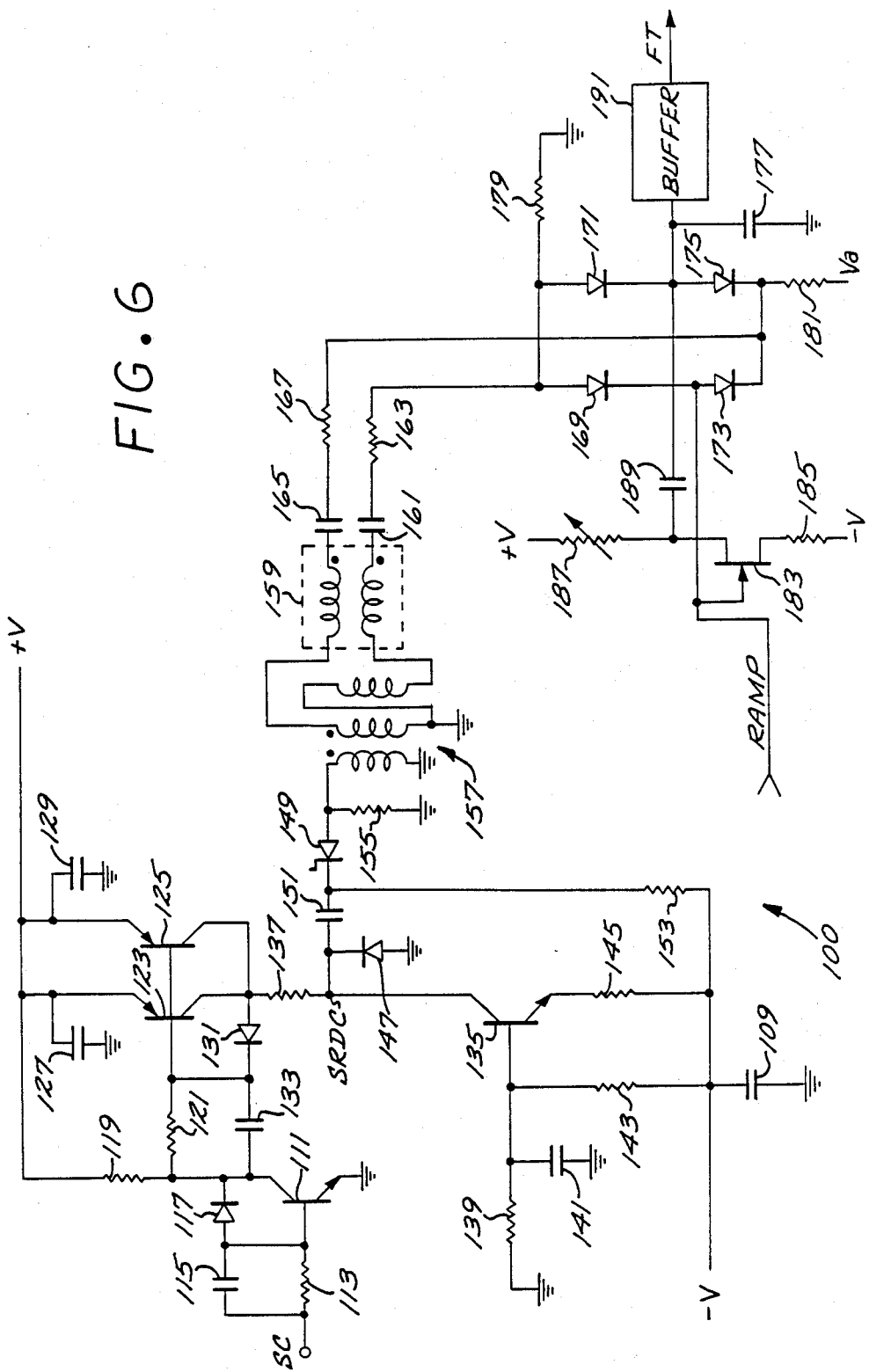
FIG. 6 is a circuit schematic diagram of part of the sample-and-hold circuit of the phase detector of FIG. 2.

Referring now to FIG. 6, shown therein is a circuit schematic of the sample-and-hold circuit 100 which includes an input NPN transistor 111 which is biased in a common-emitter configuration. The sample control signal SC is provided to the base of the input transistor 111 via an input resistor 113 and a speed-up capacitor 115 which is in parallel with the resistor 113. A Schottky diode 117 is coupled across the base and collector terminals of the transistor 111 to prevent the transistor 111 from saturating. The collector of the transistor 111 is further connected to the source of positive supply voltage +V through a biasing resistor 119 and also provides inputs via a resistor 121 to the base terminals of parallel PNP transistors 123 and 125.

The emitters of the parallel transistors 123 and 125 are connected to the source of positive supply voltage +V. Capacitors 127 and 129 are coupled between ground and the emitters of the parallel transistors 123 and 125, and function to prevent signal spikes from entering the power supply circuitry. A Schottky diode 131 has its anode connected to the collectors of the transistors 123 and 125, and has its cathode connected to the base terminals of the parallel transistors 123 and 125. The Schottky diode 131 functions as a clamp to prevent the transistors 123 and 125 from saturating. A speed-up capacitor 133 is connected between the cathode of the diode 131 and a collector of the transistor 111.

An NPN transistor 135 is configured as a constant current sink for the transistors 123 and 125 which have their collector terminals connected to the collector terminal of the transistor 135 via a resistor 137. A resistor 139 and a capacitor 141 are connected in parallel between ground and the base of the transistor 135. The base of the transistor 135 is further coupled to a source of negative supply voltage −V via a resistor 143.

The emitter of the transistor 135 is coupled to the source of negative supply voltage −V via a resistor 145. A capacitor 109 is coupled between the source of negative supply voltage −V and ground to prevent signal spikes from entering the power supply circuitry. The collector of the transistor 135 is further connected to the cathode of a diode 147 which has its anode connected to ground.

When the transistors 123 and 125 are conducting, they comprise a low impedance current source and their collectors provide current to the collector of the transistor 135. The diode 147 is non-conducting when the transistors 123 and 125 are conducting, and is conducting when the transistors 123 and 125 are non-conducting.

The cathode of a step recovery diode (SRD) 149 is coupled via a DC blocking capacitor 151 to the collector of the transistor 135, and is also coupled via a resistor 153 to the source of negative supply voltage −V. The anode of the SRD is coupled to ground via a resistor 155 which is in parallel with the input to a trifilar transformer 157. The outputs of the trifilar transformer 157 are connected to a bifilar balun 159 which provides balanced currents. One output of the bifilar balun 159 is connected to a capacitor 161 which is in series with a resistor 163. The other output of the bifilar balun 159 is connected to a capacitor 165 which is in series with a resistor 167.

When the transistors 123 and 125 are non-conducting, the SRD 149 is forward biased. The forward bias current for the SRD 149 is controlled by the resistor 153. When the transistors 123 and 125 are conducting, the SRD 149 is reverse biased. The reverse bias current for the SRD 149 is provided by the transistors 123 and 125.

The outputs of the bifilar balun 159 are coupled to a diode sampling bridge which includes the diodes 169, 171, 173 and 175. Specifically, the resistor 163 is connected to the anodes of the diodes 169 and 171. The resistor 167 is connected to the cathodes of the diodes 173 and 175. The cathode of the diode 169 is connected to the anode of the diode 173, and the cathode of the diode 171 is connected to the anode of the diode 175.

The RAMP signal provides an input to the diode bridge and is connected to the node between the diode 169 and the diode 173. The output of the sampling bridge is at the node between the diode 171 and the diode 175, and a hold capacitor 177 is connected between such node and ground. The voltage on the hold capacitor 177 is provided to a buffer 191 which produces the fine tune signal FT for the VCO 40 (FIG. 1).

In order to reduce perturbations on the hold capacitor 177, the diodes 169, 171, 173 and 175 should be very closely matched as to forward voltage drop and as to reverse bias capacitance since glitches would be caused by mismatch. By way of example, forward drop matching should be within about 10 millivolts and reverse bias capacitance should be within a few tenths of a picofarad.

Figure 7:
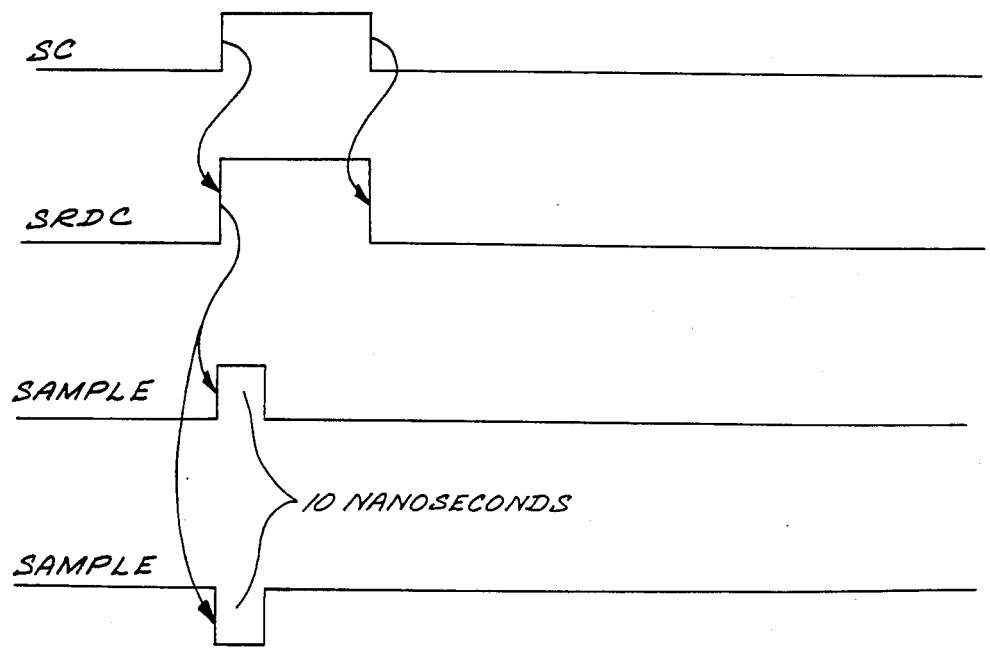
FIG. 7 is a timing diagram of certain signals in the sample-and-hold circuit of FIG. 6.

The overall operation of the sample-and-hold circuit 100 thus far described is best understood with reference to the timing diagram of FIG. 7. Specifically, the presence of a sample control signal SC pulse causes a control pulse SRDC to be formed at the collector of the transistor 135 (FIG. 6). In the absence of the control pulse SRDC, the SRD 149 is normally forward biased and on. The leading edge of the control pulse SRDC causes the voltage at the cathode of the SRD 149 to go high, thereby reverse biasing the SRD 149 which tends to turn off.

As a result of the control pulse SRDC and the turn-off of the SRD 149, the diode bridge (diodes 169, 171, 173 and 175) receives a sample signal having a leading edge determined by the leading edge of the control pulse SRDC and having a trailing edge determined by the turn-off of the SRD 149. Specifically, a positive going SAMPLE pulse is provided to the anodes of the diodes of 169 and 171, and a negative going $\overline{\text{SAMPLE}}$ pulse is simultaneously provided to the cathodes of the diodes 173 and 175. When the SRD control pulse SRDC goes low, the SRD 149 can turn on again.

The width of the sample signal (SAMPLE and $\overline{\text{SAMPLE}}$) is particularly defined by the delay between the leading edge of the control pulse SRDC and the turn-off of the SRD 149. Such delay results from the time interval necessary to deplete carriers in the SRD 149. Specifically, with more current being conducted by the SRD, the SRD takes longer to turn off. As discussed previously, the forward bias current for the SRD 149 is controlled by the resistor 153.

Referring again to the diode bridge, a resistor 179 is connected between the interconnected anodes of the diodes 169, 171, and ground. A resistor 181 having the same value as the resistor 179 is connected between the interconnected cathodes of the diodes 173 and 175, and a source of variable voltage $V_a$. The voltage level for $V_a$ is chosen so it is about two times the nominal voltage on the hold capacitor 177 when the frequency synthesizer is phase-locked.

An FET amplifier 183 receives the RAMP signal as an input on its gate terminal. The source of the FET 183 is coupled to the source of negative supply voltage $-V$ via a resistor 185. The drain of the FET 183 is coupled to the source of positive supply voltage $+V$ via a variable resistor 187. A capacitor 189 is connected between the drain of the FET 183 and the node formed by the cathode of the diode 171, the anode of the diode 175, and one terminal of the hold capacitor 177.

The FET 183 functions as a 180 degree phase inverter which cooperates with the capacitor 189 to cancel or neutralize the leakage of the RAMP signal ("RAMP blow-through") across the diode bridge comprising the diodes 169, 171, 173, and 175 when the diodes are non-conducting. The current provided by the FET 183 to the hold capacitor 177 is controlled by setting the variable resistor 187 so that the effects of the RAMP signal leakage through the non-conducting diodes are cancelled.

With the foregoing described sample-and-hold circuit, a very short sample period is achieved thereby reducing the glitches on the hold capacitor 177. Further, RAMP blow-through is substantially cancelled, thereby substantially reducing the droop in the voltage of the hold capacitor 177 in between sample times. By reducing such perturbations on the voltage of the hold capacitor 177, spurious signals at the output of the VCO 40 are substantially reduced.

Although the foregoing has been a description and illustration of specific embodiments of the invention, various modifications and changes thereto can be made by persons skilled in the art without departing from the scope of the invention as defined by the following claims.

What is claimed is:

1. A phase-locked frequency synthesizer comprising:
    a voltage controlled oscillator (VCO) for providing an output signal having a selectable output frequency; and
    divider means responsive to said VCO output signal for dividing by a division ratio N and for providing a divide-by-N signal, said VCO output frequency being related to said division ratio N;
    means for providing a reference frequency signal;
    phase detector means responsive to said reference frequency signal and said divide-by-N signal for providing to said voltage controlled oscillator a fine tune signal indicative of the phase relation between said reference frequency signal and said divide-by-N signal, said phase detector means having a gain which is adjusted to provide a substantially constant ratio of the gain of the phase detector means to the division ratio N.

2. A phase-locked frequency synthesizer comprising:
    a voltage controlled oscillator (VCO) for providing an output signal having a selectable output frequency; and
    divider means responsive to said VCO output signal for dividing by a division ratio N and for providing a divide-by-N signal, said VCO output frequency being related to said division ratio N;
    means for providing a reference frequency signal;
    phase detector means responsive to said reference frequency signal and said divide-by-N signal for providing to said voltage controlled oscillator a fine tune signal indicative of the phase relation between said reference frequency signal and said divide-by-N signal, said phase detector means including means for providing a gain in said phase detector means which maintains a substantially constant ratio between the gain in said phase detector means and the division ratio N.

* * * * *

UNITED STATES PATENT AND TRADEMARK OFFICE
CERTIFICATE OF CORRECTION

PATENT NO. : 4,771,248

DATED : September 13, 1988

INVENTOR(S) : Crawford et al.

It is certified that error appears in the above-identified patent and that said Letters Patent is hereby corrected as shown below:

Column 1, line 5: replace "N00024-82-C-5353 with --N00039-82-C-0071--.

Column 6, line 48: add the following table:

--TABLE 1

| QD | QC | QB | QA | FREF | CNTLD |
|----|----|----|----|------|-------|
| 0  | 0  | 0  | 0  | 0    | 1     |
| 0  | 0  | 0  | 1  | 0    | 1     |
| 0  | 0  | 1  | 0  | 1    | 1     |
| 0  | 0  | 1  | 1  | 1    | 1     |
| 0  | 1  | 0  | 0  | 0    | 1     |
| 0  | 1  | 0  | 1  | 0    | 1     |
| 0  | 1  | 1  | 0  | 0    | 1     |
| 0  | 1  | 1  | 1  | 0    | 1     |
| 1  | 0  | 0  | 0  | 0    | 1     |
| 1  | 0  | 0  | 1  | 0    | 0 --  |

Signed and Sealed this

Twenty-eighth Day of March, 1989

Attest:

DONALD J. QUIGG

Attesting Officer

Commissioner of Patents and Trademarks